(12) United States Patent
Ohsaki

(10) Patent No.: US 7,403,263 B2
(45) Date of Patent: Jul. 22, 2008

(54) EXPOSURE APPARATUS

(75) Inventor: Yoshinori Ohsaki, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/734,606

(22) Filed: Apr. 12, 2007

(65) Prior Publication Data

US 2007/0188728 A1    Aug. 16, 2007

Related U.S. Application Data

(63) Continuation of application No. 11/008,379, filed on Dec. 9, 2004, now Pat. No. 7,221,431.

(30) Foreign Application Priority Data

Dec. 9, 2003    (JP) ............................. 2003-409881

(51) Int. Cl.
| | |
|---|---|
| G03B 27/42 | (2006.01) |
| G03B 27/52 | (2006.01) |
| G03B 27/74 | (2006.01) |
| G03B 27/58 | (2006.01) |

(52) U.S. Cl. .................. 355/53; 355/30; 355/68; 355/72

(58) Field of Classification Search ............. 355/30, 355/52, 53, 55, 68, 72; 359/400, 401; 430/30, 430/311
See application file for complete search history.

(56) References Cited

U.S. PATENT DOCUMENTS

| | | | |
|---|---|---|---|
| 4,480,910 A | 11/1984 | Takanashi et al. | 355/30 |
| 5,040,020 A | 8/1991 | Rauschenbach et al. | 355/53 |
| 5,243,195 A | 9/1993 | Nishi | 250/548 |
| 6,954,256 B2 | 10/2005 | Flagello et al. | 355/53 |
| 7,221,431 B2 * | 5/2007 | Ohsaki | 355/53 |
| 2002/0163629 A1 | 11/2002 | Switkes et al. | 355/53 |
| 2006/0170891 A1 | 8/2006 | Nishinaga et al. | 355/53 |
| 2006/0181690 A1 | 8/2006 | Nishinaga et al. | 355/53 |

FOREIGN PATENT DOCUMENTS

JP    10-303114    11/1998

* cited by examiner

*Primary Examiner*—Alan A Mathews
(74) *Attorney, Agent, or Firm*—Morgan & Finnegan, LLP

(57) ABSTRACT

An exposure apparatus includes a projection optical system for projecting a pattern on a reticle onto an object to be exposed, a reference mark that serves as a reference for an alignment between the reticle and the object, a first fluid that has a refractive index of 1 or greater, and fills a space between at least part of the projection optical system and the object and a space between at least part of the projection optical system and the reference mark, and an alignment mechanism for aligning the object by using the projection optical system and the first fluid.

1 Claim, 14 Drawing Sheets

EXPOSURE APPARATUS

This is a continuation of prior application Ser. No. 11/008,379, filed Dec. 9, 2004, now U.S. Pat. No. 7,221,431 to which priority under 35 U.S.C. § 120 is claimed and which is hereby incorporated by reference herein in its entirety as if fully set forth herein.

BACKGROUND OF THE INVENTION

The present invention relates generally to an exposure apparatus, and more particularly to an exposure apparatus used to manufacture various devices including semiconductor chips such as ICs and LSIs, display devices such as liquid crystal panels, sensing devices such as magnetic heads, and image pickup devices such as CCDs, as well as fine patterns used for micromechanics. The present invention is suitable, for example, for an immersion type exposure apparatus that immerses, in the fluid, the final surface of the projection optical system and the surface of the object to be exposed, and exposes the object through the fluid.

Conventionally employed reduction projection exposure apparatuses use a projection optical system to project or transfer a circuit pattern on a mask or a reticle onto a wafer, etc., in manufacturing such a fine semiconductor device as a semiconductor memory and a logic circuit in the photolithography technology.

The critical dimension transferable by the projection exposure apparatus or resolution is proportionate to a wavelength of light used for exposure, and inversely proportionate to the numerical aperture ("NA") of the projection optical system. The shorter the wavelength is, the better the resolution is. Smaller resolution has recently been required with a demand for the finer processing to the semiconductor devices. Therefore, in addition to use of the exposure light with a small wavelength, the projection optical system is expected to improve the resolution by using a higher NA. At present, the projection optical system has accelerated an increase of its NA, and it is expected to develop the projection optical system having a NA of 0.9 or greater.

On the other hand, the light sources for the exposure apparatus have changed from a KrF laser (with a wavelength of 248 nm) to an ArF laser (with a wavelength of 193 nm). Currently, developments of an F2 laser (with a wavelength of 157 nm) and EUV (with a wavelength of 13.5 nm) are promoted for the next generation light sources.

With this background, an immersion exposure has attracted attentions as a method that uses the ArF laser and the F2 laser for more improved resolution. See, for example, Japanese Patent Application, Publication No. 10-303114. The immersion exposure arranges the fluid as a medium at a wafer side of the projection optical system (or an image surface side), and promotes a higher NA. Specifically, the projection optical system's NA is $n \cdot \sin \theta$ where "n" is a refractive index of the medium, which can be increased up to "n" by filling the medium (fluid) having a refractive index greater than that of the air, i.e., $n>1$, in at least part of the space between the projection optical system and the wafer. In other words, the immersion exposure improves the resolution by increasing the projection optical system's NA viewed from the wafer side up to 1 or greater.

On the other hand, in order to align the reticle with the wafer during the exposure, the exposure apparatus includes plural alignment optical systems. The alignment optical system is roughly classified into two types, i.e., an off-axis alignment optical system that detects an alignment mark on the wafer and uses it for the alignment for the wafer, and a through the reticle ("TTR") alignment optical system that detects, via the projection optical system, a position of the alignment mark on the wafer (or wafer-side reference plate provided on a wafer stage), which is referred to as a wafer-side pattern and corresponds to a reticle-side pattern that is an alignment mark on the reticle (or reticle-side reference plate provided on a reticle stage). The TTR alignment optical system is also referred to as a through the lens ("TTL") alignment optical system.

Since the immersion type exposure apparatus fills the fluid in the space between the projection optical system and the wafer so as to implement the NA of 1 or greater, there is no imaging relationship between the reticle-side pattern and the wafer-side pattern in the TTR alignment optical system. As a result, the light intensity detecting method for detecting the light intensity using a light intensity sensor provided on the wafer stage, and then a positional relationship between the reticle-side pattern and the wafer-side pattern, can neither image the reticle-side pattern on the wafer-side pattern nor precisely align the reticle-side pattern with the wafer-side pattern. On the other hand, an image detecting method that images an alignment mark on an image pickup device cannot image the wafer-side pattern on the image pickup device via the projection optical system, or align the reticle-side pattern with the wafer-side pattern.

The light intensity detecting method has an area that has a refractive index of 1, such as the air and vacuum, between the wafer-side reference plate and the light intensity sensor. When reticle-side pattern is imaged on the wafer-side pattern by using the light having the NA greater than 1, the light having the NA greater than 1 is totally reflected on the back surface of the wafer-side reference plate, which back surface opposes to the pattern surface, and does not reach the light intensity sensor. Therefore, a correct measurement value cannot be obtained due to offsets of the measurement values and the deteriorated measurement reproducibility. On the other hand, the light having the NA smaller than 1 is not totally reflected on the back surface of the wafer-side reference plate, but the reflectance becomes higher due to the large incident angle. Therefore, disadvantageously, the light having a high NA is reflected on the back surface of the wafer-side reference plate and its light intensity incident upon the light intensity sensor is smaller than that of the light having a small NA. The image detecting method that requires the illumination light to enter the back surface side of the wafer-side reference plate cannot use the incident light having a NA greater than 1, due to the area that has a refractive index of about 1 between the wafer-side reference plate and an emitting section that emits the illumination light.

A non-immersion type exposure apparatus has a similar problem that the light having a large NA is reflected on the back surface of the wafer-side reference plate, due to the higher NA used for the projection optical system. In order to receive the light having an arbitrary NA, a sensor needs to have a large area and, when a light intensity sensor having a large area is provided on the wafer stage, the wafer stage becomes too large.

BRIEF SUMMARY OF THE INVENTION

Accordingly, it is an exemplary object of the present invention to provide an exposure apparatus that employs a projection optical system that has a high NA (such as an immersion type or $1<NA$), and provides precise alignments and exposures with a good resolution without increasing the size of the apparatus.

An exposure apparatus according to one aspect of the present invention includes a projection optical system for projecting a pattern on a reticle onto an object to be exposed, a reference mark that serves as a reference for an alignment between the reticle and the object, a first fluid that has a refractive index of 1 or greater, and fills a space between at least part of the projection optical system and the object and a space between at least part of the projection optical system and the reference mark, and an alignment mechanism for aligning the object by using the projection optical system and the first fluid.

An exposure apparatus according to another aspect of the present invention includes a projection optical system for projecting a pattern on a reticle onto an object, a reference mark that serves as a reference for an alignment between the reticle and the object, a light-receiving element for receiving light that transmits the reference mark, and a fluid that has a refractive index of 1 or greater, and fills a space between the reference mark and the light-receiving element.

An exposure apparatus according to another aspect of the present invention includes a projection optical system for projecting a pattern on a reticle onto an object, a reference mark that serves as a reference for an alignment between the reticle and the object, an irradiating section for radiating light that transmits the reference mark and enters the projection optical system, and a fluid that has a refractive index of 1 or greater, and fills a space between the reference mark and the irradiating section.

An exposure apparatus according to another aspect of the present invention includes a projection optical system for projecting a pattern on a reticle onto an object, a reference mark that serves as a reference for an alignment between the reticle and the object, and an anti-reflection member for preventing a total reflection of light that has passed the reference mark and has not yet been received by the light-receiving element.

An exposure apparatus according to another aspect; of the present invention includes a projection optical system for projecting a pattern on a reticle onto an object, a light-receiving element for receiving light that transmits the reference mark, and an adjuster, arranged between the reference mark and the light-receiving element, for adjusting an numerical aperture of the light.

An exposure method according to another aspect of the present invention for exposing a pattern on a reticle onto an object includes the step of aligning the reticle and the object with each other by using light having a numerical aperture of 1 or greater.

A device manufacturing method according to another aspect of the present invention includes the steps of exposing an object using the above exposure apparatus, and developing the object that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
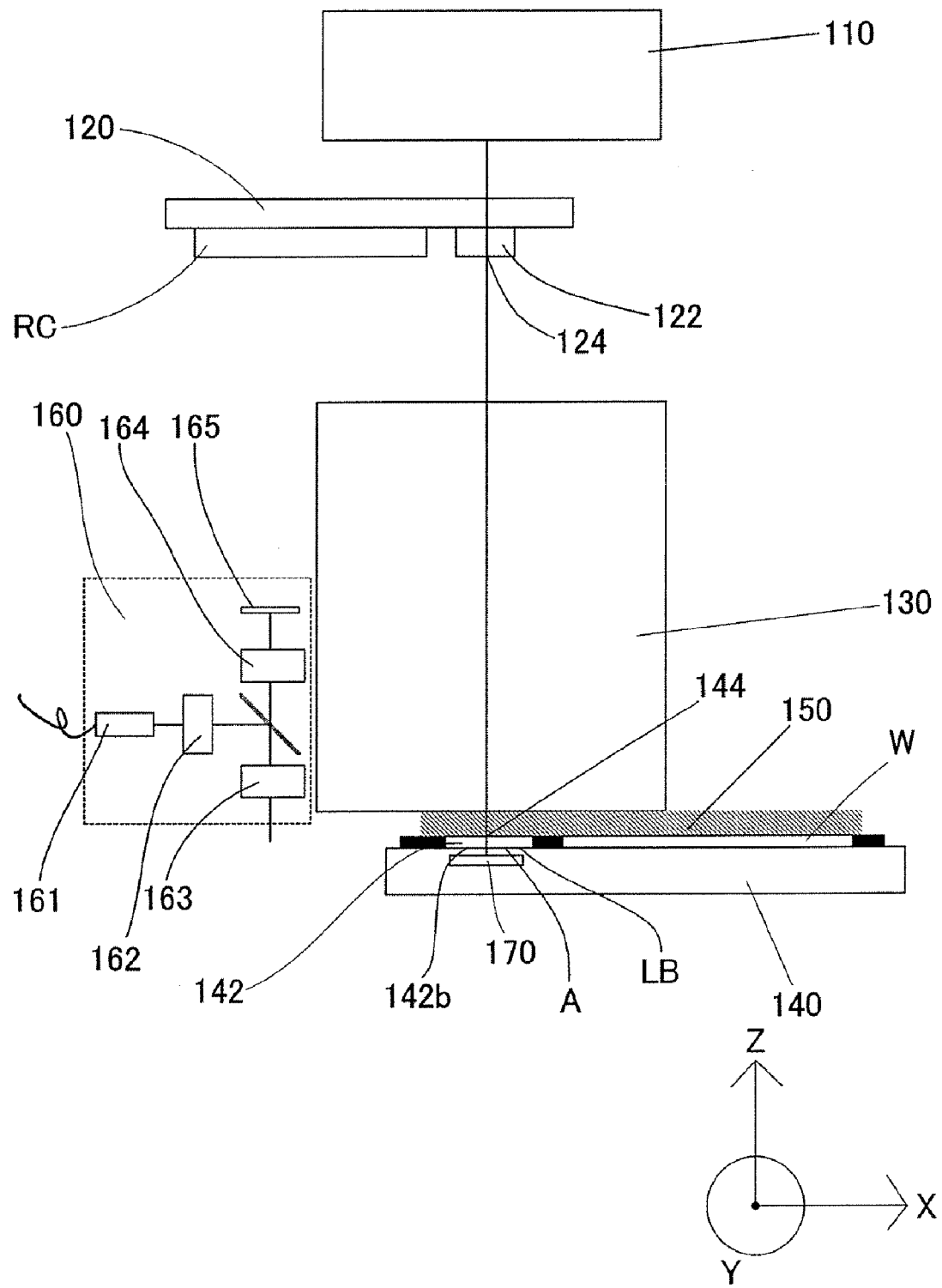
FIG. 1 is a schematic block diagram of a structure of an exposure apparatus according to one aspect of the present invention.

Referring now to the accompanying drawings, a description will be given of an exposure apparatus according to one aspect of the present invention. A like element in each figure is designated by the same reference numeral, and a duplicate description thereof will be omitted. Here, FIG. 1 is a schematic block diagram of the exposure apparatus 100 according to one aspect of the present invention.

The exposure apparatus 100 includes, as shown in FIG. 1, an illumination apparatus 110, a reticle stage 120, a projection optical system 130, a wafer stage 140, a fluid 150, an off-axis optical system 160, and a light-receiving element 170. The exposure apparatus 100 is an immersion type exposure apparatus that partially or locally immerses the final surface of the projection optical system 130 at the wafer W side in the fluid 150, and exposes a pattern on a reticle RC onto a wafer W via the fluid 150. The exposure apparatus 100 of the instant embodiment is a step-and-scan projection exposure apparatus, but the present invention is applicable to a step-and-repeat exposure manner or other exposure methods.

The exposure apparatus 100 provides the wafer stage 140 with a wafer-side reference plate 142, forms a reference mark (or a reticle-side pattern) 124 that is a reference for the alignment between the reticle RC and the wafer W, and immerses the space between the wafer-side reference plate 142 and the projection optical system 130 in the fluid 150. This configuration uses the projection optical system 130 to establish an imaging relationship between the wafer-side pattern 144 and the reference mark (or the reticle-side pattern) 124 on the reticle RC or the reticle-side reference plate 122. It is thus possible to detect a positional relationship between the reticle-side pattern 124 and e wafer-side pattern 144 via the projection optical system 130 by means of the exposure light for calibration such as baseline measurements.

The illumination apparatus 110 illuminates the reticle RC on which a circuit pattern to be transferred is formed, and includes a light source section and an illumination optical system.

The light source section includes a laser as a light source. The laser-may-be pulsed laser such as an ArF excimer laser with a wavelength of approximately 193 nm, a KrF excimer laser with a wavelength of approximately 248 nm, a $F_2$ laser with a wavelength of approximately 1.57 nm, etc. A kind of laser, the number of laser units, and a hype of light source section is not limited.

The illumination optical system is an optical system that introduces the light from the light source section to the reticle RC, and includes a lens, a mirror, a light integrator, a stop, and the like. The light integrator may include a fly-eye lens or an integrator formed by stacking two sets of cylindrical lens array plates (or lenticular lenses), and be replaced with an optical rod or a diffractive element. The Illumination optical system may use both on-axis light and off-axis light.

The reticle RC has a circuit pattern (or an image) to be transferred. The reticle RC is made, for example, of quartz and supported and driven by the reticle stage 120. Diffracted light through the reticle RC is projected onto the wafer W through the projection optical system 130. The reticle RC and wafer W are located in an optically conjugate relationship. Since the exposure apparatus 100 is a step-and-scan exposure apparatus (or a scanner), it transfers a pattern on the reticle RC onto the wafer W by scanning the reticle RC and wafer W. When the exposure apparatus 100 is a step-and-repeat exposure apparatus (or a stepper), it exposes while making still the reticle RC and wafer W.

The reticle stage 120 supports the reticle RC, is connected to a drive mechanism (not shown), and controls driving of the reticle RC. The reticle stage 120 and the projection optical system 130 are provided on a barrel stool supported via a damper, for example, to the base frame placed on the floor. The drive mechanism (not shown) includes a linear motor and the like, and drives the reticle stage 120 in XY directions, thus moving the reticle RC.

A reticle-side reference plate (R-side, reference plate) 122 is provided in a predetermined area near the reticle RC on the reticle stage so that the pattern surface of the R-side reference plate 122 is approximately level with the pattern surface of the reticle RC. A plurality of reticle-side patterns 124 for alignments are formed on the pattern surface of the R-side reference plate 122. Since the reticle-side pattern 124 is similar to the wafer-side pattern 144, which will be described later, a detailed description thereof will be omitted.

The projection optical system 130 serves to image diffracted light from a pattern on the reticle RC onto the wafer W. The projection optical system 130 may use an optical system including plural lens elements, an optical system including plural lens elements and at least one concave mirror (a catadioptric optical system), an optical system including plural lens elements and at least one diffractive optical element such as a kinoform, a full mirror type optical system, and so on. Any necessary correction of the chromatic aberration may use plural lens units made from glass materials having different dispersion values (Abbe values), or arrange a diffractive optical element such that it disperses in a direction opposite to that of the lens unit.

The wafer W is an object to be exposed, onto which a photoresist is applied. The wafer W broadly covers a liquid crystal substrate and other objects to be exposed. The wafer W is supported by a wafer stage 140.

The wafer stage 140 supports the water W and controls driving of the wafer W. The wafer stage 140 moves the wafer W using a linear-motor in the XYZ directions. The reticle RC and wafer W are, for example, scanned synchronously, and the positions of the reticle stage 120 and the wafer stage 140 are monitored, for example, key a laser interferometer and the like, so that both are driven at a constant speed ratio. The wafer stage 140 is installed on a stage surface plate supported on the floor and the like, for example, via a damper.

A wafer-side reference plate (W-side reference plate) 142 is provided in a predetermined area near the wafer W on the wafer stage 140 so that the pattern surface of the W-side reference plate 142 is approximately level with the top surface of the wafer W (or an imaging surface of the projection optical system 130).

Figure 2:
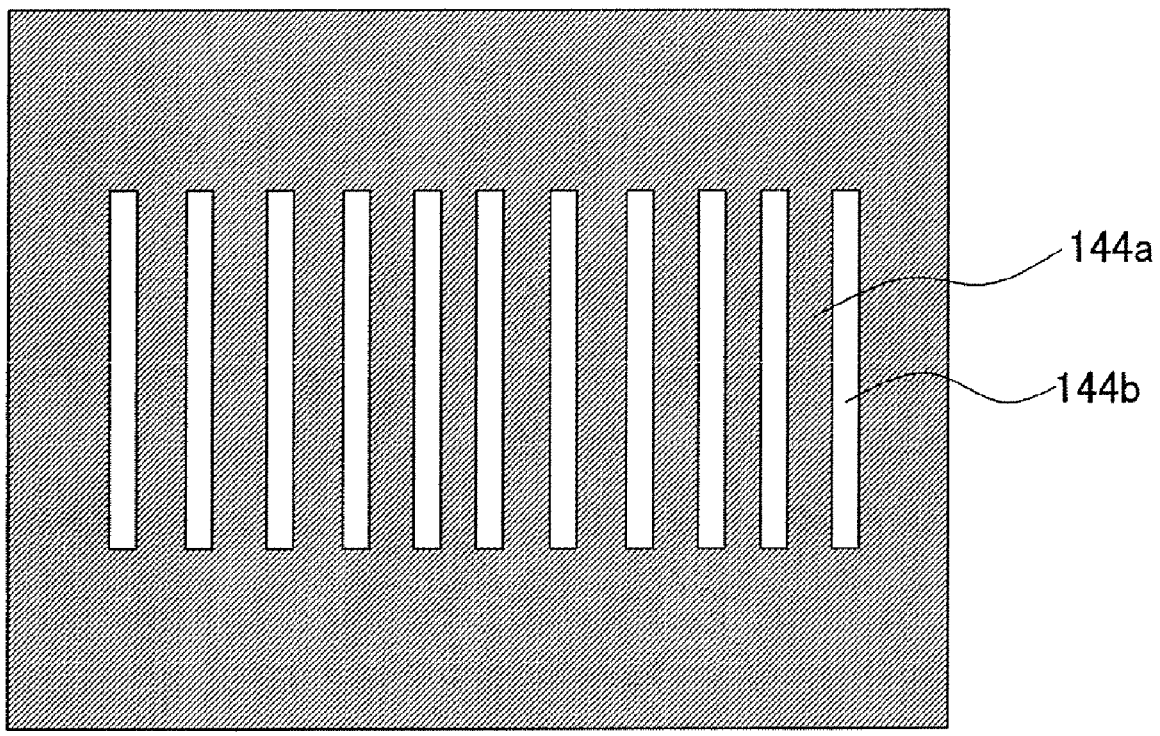
FIG. 2 is a plane view showing one exemplary wafer-side pattern formed on a W-side reference plate.

A plurality of wafer-side patterns 144 for the alignments are formed on the pattern surface of the W-side reference plate 142. The wafer-side pattern 144 is formed as a repetitive pattern of light shielding parts 144a and light transmitting parts 144h as shown in FIG. 2, and the instant embodiment makes a critical dimension, a pitch, etc. of the light shielding part 144a and light transmitting parts 144b different from the reticle-side pattern 124 by a magnification of the projection optical system 130. Here, FIG. 2 is a plane view showing one exemplary wafer-side pattern 144 formed on the W-side reference plate 142.

The bottom surface of the projection optical system 130 is immersed in the fluid 150. The fluid 150 selects its material that has a good transmittance to the wavelength of the exposure light, does not contaminate the projection optical system 130, and matches the resist process. The fluid 150 selects its material having a refractive index greater than 1 so as to increase the NA of the projection optical system 130. The coating to a refractive element (i.e., a lens) that has a final surface of the projection optical system 130 protects the element from the fluid 150.

As discussed above, the fluid 150 fills the space between the final surface of the projection optical system 130 and the wafer-side pattern 144 on the W-side reference plate 142, and serves to establish an imaging relationship between the reticle-side pattern 124 and the wafer-side pattern 144 via the projection optical system 130.

The exposure apparatus 100 includes an alignment mechanism for aligning the reticle RC with the wafer W in order to expose a pattern on the reticle 115 onto the wafer W. The alignment mechanism includes a wafer alignment optical system, and a calibration system. The wafer alignment optical system uses an off-axis alignment optical system 160 different from the projection optical system 130 to detect the alignment mark on the wafer W (or the wafer-side pattern 144 on the W-side reference plate 142). The calibration system detects, via the projection optic system 130, a position of the wafer-side pattern 144 on the wafer W (or W-side reference plate 142 on the wafer stage 140) relative to the reticle-side pattern 124 on the reticle RC (or the R-side reference plate 122 on the reticle stage 120).

The off-axis alignment optical system 160 serves to detect a position of the wafer W, and includes an alignment light source (not shown), a fiber 161, an illuminating section 162, an objective lens 163, a relay lens 164, and an image pickup device 165.

The off-axis alignment optical system 160 introduces light that is emitted from the alignment bight source and has a wavelength that is not used for the exposure, to the illuminating section 162 via the fiber 161, and illuminates the alignment mark on the wafer W. The objective lens 163 and the relay lens 164 enlarge the illuminated alignment mark, and the resultant light is imaged on the image pickup device 165, such as a CCD. The off-axis alignment optical system 160 detects the position of the wafer W by utilizing the fact that the image position on the image pickup device 165 changes as the alignment mark's position changes. The alignment for the wafer W by the off-axis alignment optical system 160 at a position different from the exposure position becomes inaccurate as the baseline or the relationship between the exposure position and the alignment position changes due to the environmental variances.

For the alignment with higher precision than the baseline's stability, the calibration system is used to measure the baseline. According to the calibration system, the illumination apparatus 110 illuminates, with the exposure light, the reticle-side pattern 124 on the R-side reference plate 122 (or the reticle RC), which has a guaranteed relative positional relationship with the reticle RC on the reticle stage 120. Then, the projection optical system 130 projects the reticle-side pattern 124 onto the wafer-side pattern 144 on the W-side reference plate 142 on the wafer stage 140. Since this embodiment immerses the space between the projection optical system 130 and the wafer-side pattern 144 (or the W-side reference plate 142) in the fluid 150, similar to the space between the projection optical system 130 and the wafer W, the reticle-side pattern 124 is successfully imaged onto the wafer-side pattern 144 on the wafer-side reference plate 142.

The light-receiving element 170 is provided at the side of the back surface 142b of the W-side reference plate 142 opposing to the surface, on which surface the wafer-side pattern 144 is formed. The light-receiving element 170 may be a light intensity sensor for detecting the light intensity of the light that transmits the wafer-side pattern 144. Alternatively, the light-receiving element 170 may be an image pickup device, such as a CCD, in the instant embodiment.

Figure 3:
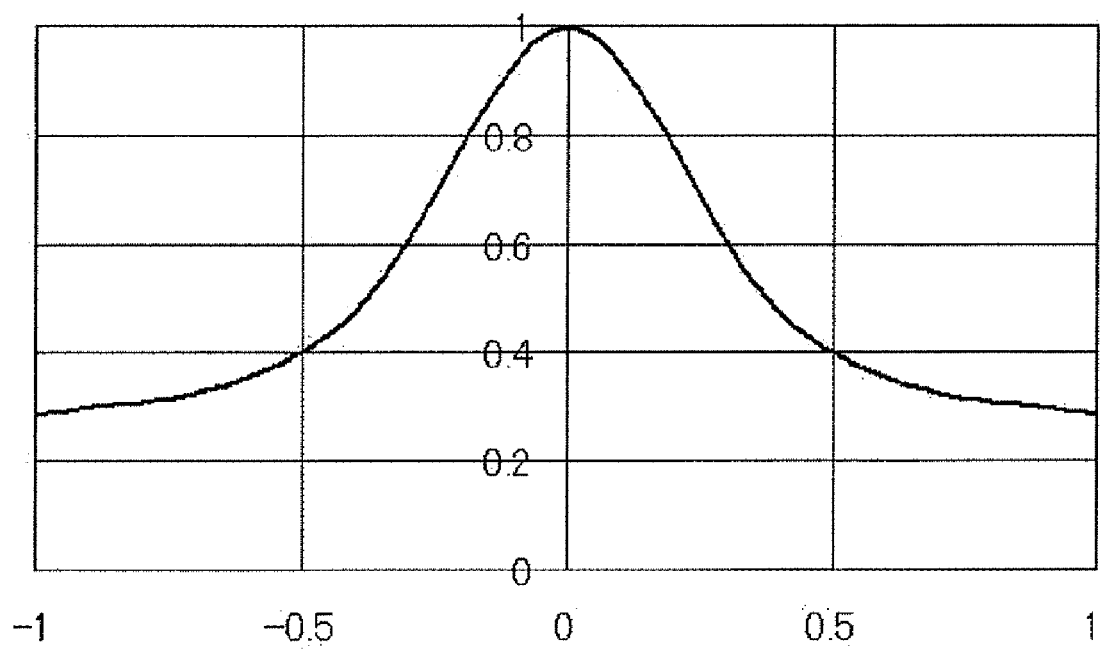
FIG. 3 is a graph showing the light intensity changes of the light that transmits the wafer-side pattern and is detected by a light-receiving element.

The reticle-side pattern 124 is projected, via the projection optical system 130, onto the wafer-side pattern 144 (i.e., a repetitive pattern of the light shielding parts 144a and the light transmitting parts 144b, which is different from the reticle-side pattern by the magnification of the projection optical system 130). While the wafer stage 140 is moved in the X direction, the light-receiving element 170 detects the light that transmits the wafer-side pattern 144 (or the W-side reference plate 142). FIG. 3 is a graph showing the light intensity changes of the light that transmits the wafer-side pattern 144 and is detected by a light-receiving element 170, where the ordinate axis is the light intensity and the abscissa axis is the position of the wafer stage 140. It is understood from FIG. 3 that the light intensity becomes maximum at a position where the image of the reticle-side pattern 124 accords with the position of the wafer-side pattern 144. This configuration precisely measures the exposure position of the reticle-side pattern 124 by the projection optical system 130.

Next, the wafer stage 140 is driven, and a distance between the exposure position (or reticle-side pattern 124) and the off-axis alignment optical system 160's position (or the baseline) is calculated by using the off-axis alignment optical system 160 and detecting a position of the wafer-side pattern 144 on the W-side reference plate 142. A pattern on the W-side reference plate 142 detected by the off-axis alignment optical system 160 may be the wafer-side pattern 144 or another pattern, whose position is guaranteed relative to the wafer-side pattern 144.

Thus, the alignment between the reticle RC and the wafer W is available by detecting the alignment mark on the wafer W using the off-axis alignment optical system 160 whose positional relationship with the exposure position has been calculated. In detecting the wafer-side pattern 144 on the W-side reference plate 142 by using the off-axis alignment optical system 160, the space between the off-axis alignment optical system 160 and the wafer-side pattern 144 (or the W-side reference plate 142) may be or may not be immersed in the fluid 150. In case of immersion, it is preferable to immerse the space between the off-axis alignment optical system 160 and the wafer W. In case of no immersion, it is preferable not to immerse the space between the off-axis alignment optical system 160 and the wafer W. In other words, it is preferable to detect a position of the W-side reference plate 142 in the same state as that of a detection of the wafer W using the off-axis alignment optical system 160.

The light-receiving element 170 can obtain the light intensity changes of the light that transmits the wafer-side pattern 144, even when the wafer stage 140 is driven in the optical-axis direction of the projection optical system 130 (or the Z direction) while the calibration system aligns the image of the reticle-side pattern 124 with the wafer-side pattern 144 in the XY directions. Since the light intensity change becomes maximum at a (best focus) position at which the reticle-side pattern 124 focuses on the wafer-side pattern 144 (or the W-side reference plate 142), the focus position of the projection optical system 130 can be detected.

Figure 13:
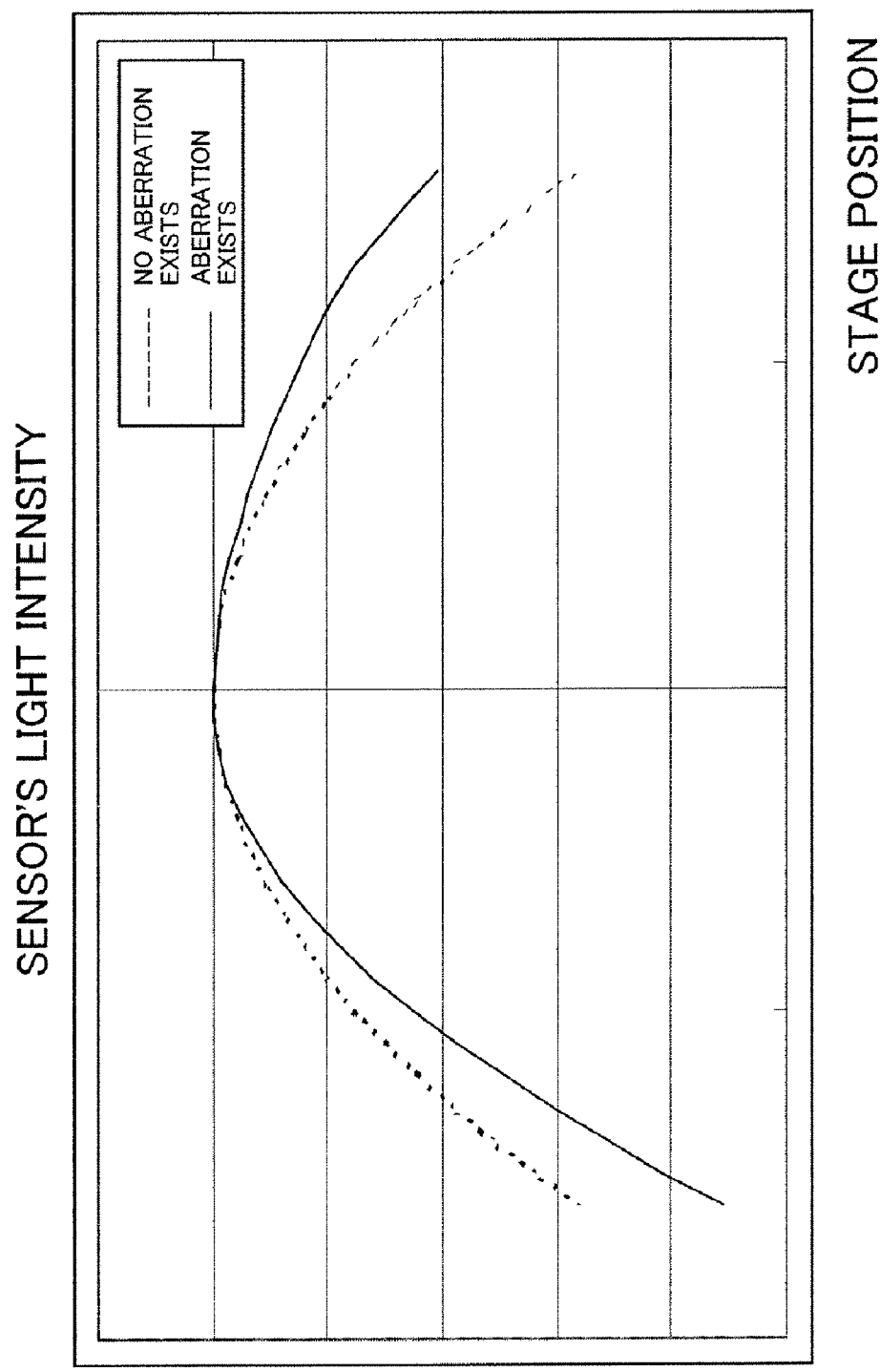
FIG. 13 is a graph showing an asymmetry of the light that transmits the wafer-side pattern detected by the light-receiving element.

The aberration (or the imaging performance) of the projection optical system 130 can be calculated by measuring the light intensity changes in detail when the wafer stage 140 is driven. For example, when the projection optical system 130 has a spherical aberration, the light intensity changes asymmetrically as the wafer stage 140 moves in the Z direction, as shown in FIG. 13. As a result of the evaluation of the degree of this asymmetry, the spherical aberration of the projection optical system 130 can be calculated. The evaluation of the asymmetry of the light intensity changes as the wafer stage 140 moves in the Z or Y direction provides a coma.

It is possible to satisfactorily form an image of the reticle-side pattern 124 onto the wafer-side pattern 144 and to provide highly accurate calibrations similar to the prior art (or in the manner similar to the prior art), by providing the W-side reference plate 142 on the wafer stage 140 and by immersing the space between the projection optical system 130 and the wafer-side pattern 144 (or the W-side reference plate 142) in the fluid 150. An immersion holding plate LP may be provided on the wafer stage 140 so as to maintain the immersion of the space between the W-side reference plate 142 and the projection optical system 130 by the fluid 150 equivalent to the immersion of the space between the wafer W and the projection optical system 130. The immersion holding plate LP serves to fill the space between the wafer W and the W-side reference plate 142, and is made of a member that makes the pattern surface of the W-side reference plate 142 level with the top surface of the wafer W. The W-side reference plate 142 is formed on the wafer stage 140 near the wafer W so that there is no clearance between the wafer W and the W-side reference plate 142.

The exposure apparatus 100 provides the W-side reference plate 142 on the wafer stage 140, and immerses the space between the projection optical system 130 and the W-side reference plate 142 in the fluid 150, establishes the imaging relationship between the reticle-side pattern 144 and the wafer-side pattern 124, and provides highly accurate calibration.

However, the exposure apparatus 100 includes an area A having a refractive index of 1, such as the air and vacuum, between the W-side reference plate 142 and the light-receiving element 170. Therefore, when the light having an NA greater than 1 is used to image the reticle-side pattern 124 on the R-side reference plate 122 on the wafer-side pattern 144 on the W-side reference plate 142, the back surface 142b of the W-side reference plate 142 totally reflects the light having an NA greater than 1 and this light cannot enter the light-receiving element 170, resulting in offsets in measurement values, the deteriorated measurement reproducibility, and incorrect measurement values. In particular, in detecting a (focus) position of the projection optical system 130 by moving the W-side reference plate 142 in the optical-axis direction of the projection optical system 130 (or the Z direction), the light-receiving element 170 does not receive the light that has the high NA and is most sensitive to the focus changes, lowering the measuring precision.

Figure 4:
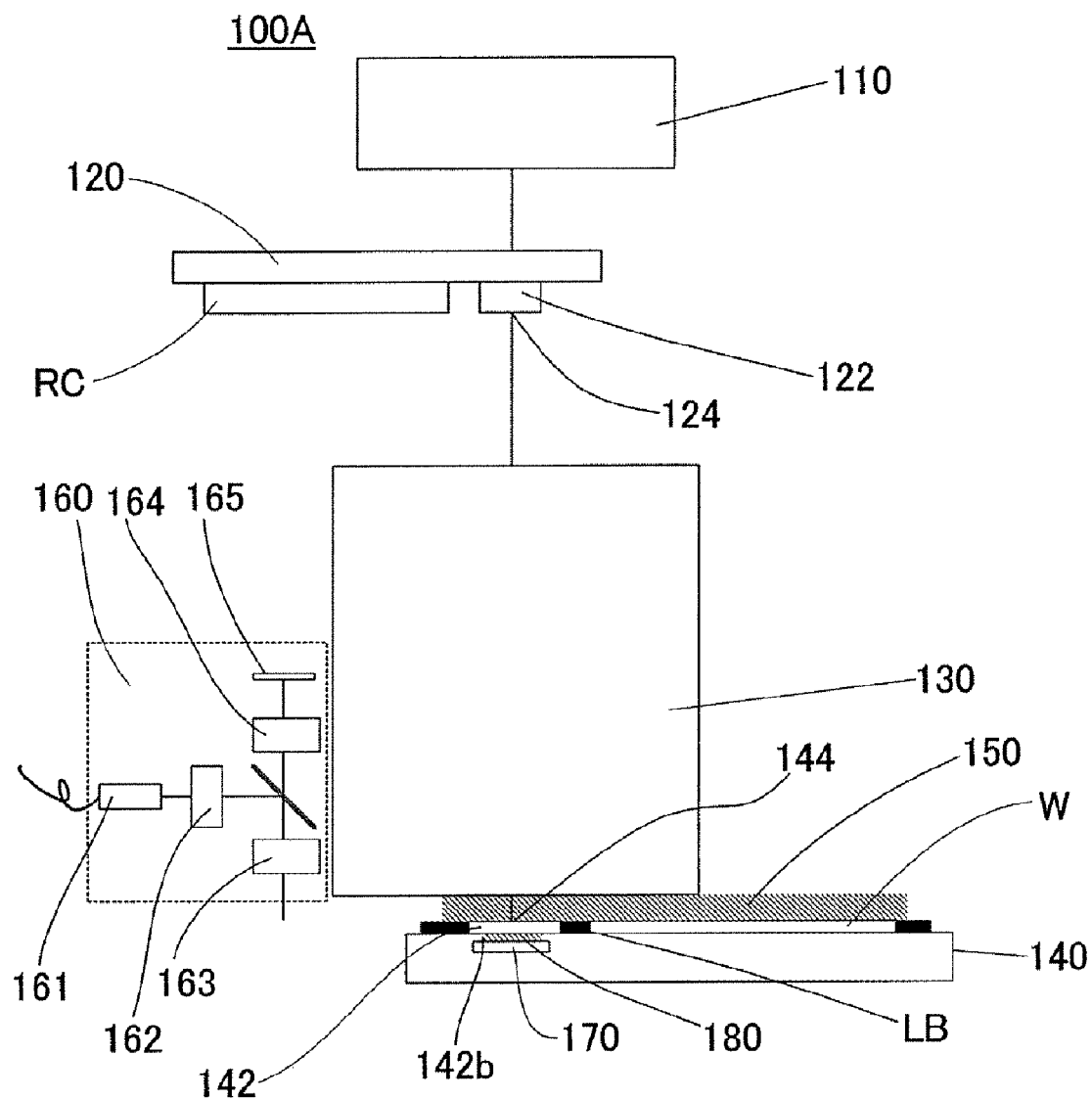
FIG. 4 is a schematic block diagram of a structure of an exposure apparatus according to another aspect of the present invention.
Figure 5:
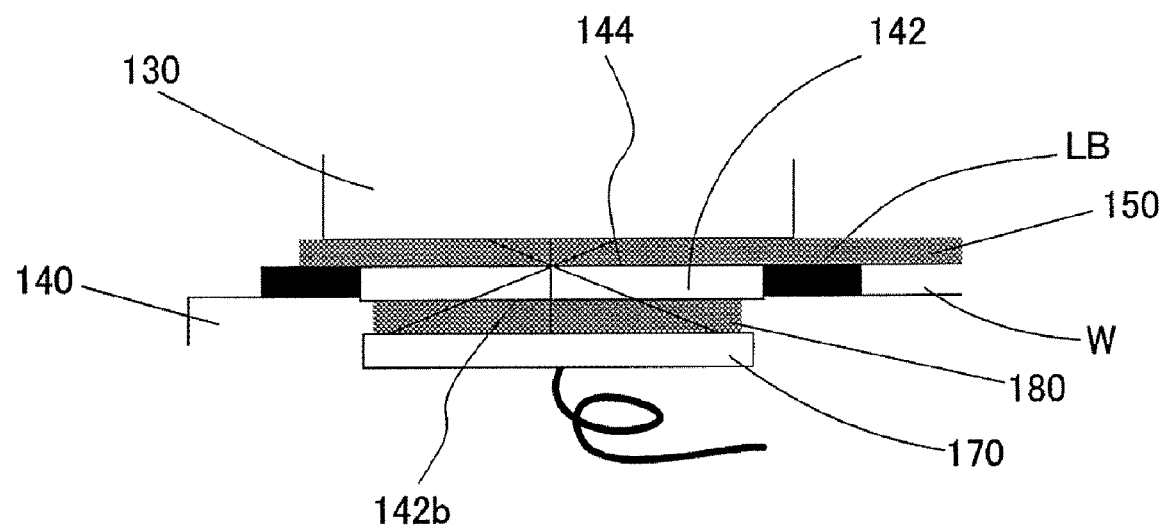
FIG. 5 is an enlarged view near the W-side reference plate of the exposure apparatus shown in FIG. 4.

Accordingly, the exposure apparatus 100A shown in FIGS. 4 and 5 immerses, in the fluid 180, not only the space between the pattern surface of the W-side reference plate 142 and the projection optical system 130, but also the space between the back surface 142b of the W-side reference plate 142 and the light-receiving element 170. The fluid 180 selects its material so that it has a good transmittance to the wavelength of the exposure light, does not contaminate the W-side reference plate 142 and the light-receiving element 170, and possesses a refractive index greater than 1. The fluid 180 may be the same as or different from the fluid 150 as long as the exposure light is not totally reflected on the back surface 142b of the W-side reference plate 142. Here, FIG. 4 is a schematic block diagram of a structure of the exposure apparatus 100A according to another aspect of the present invention. FIG. 5 is an enlarged view near the W-side reference plate 142 of the exposure apparatus 100A shown in FIG. 4.

An immersion of the space between the back surface 142b of the w-sided reference plate 142 and the light-receiving element 170 in the fluid 180 that has a refractive index greater than 1 enables the light that transmits the wafer-side pattern 144 to enter the light-receiving element 170 without a total reflection on the back surface 142b of the W-side reference plate 142, even when the projection optical system 130 has an NA greater than 1. In other words, the light having a high NA can enter the light-receiving element 170. This configuration eliminates the offset from the measurement value, maintains the measurement reproducibility, and obtains the correct measurement value. In particular, the focus position of the projection optical system 130 can be detected with high precision.

It is conceivable to use water for the fluid (or the fluids 150 and 180) as an immersion material down to the wavelength of the ArF excimer laser. However, as shown in FIGS. 4 and 5, the configuration that fills the space between the back surface 142b of the W-side reference plate 142 and the light-receiving element 170 (or which immerses the light-receiving element 170 entirely in the fluid 180) with the fluid 180 as the water is often very difficult because there are some electric contacts around the light-receiving element 170.

Figure 6:
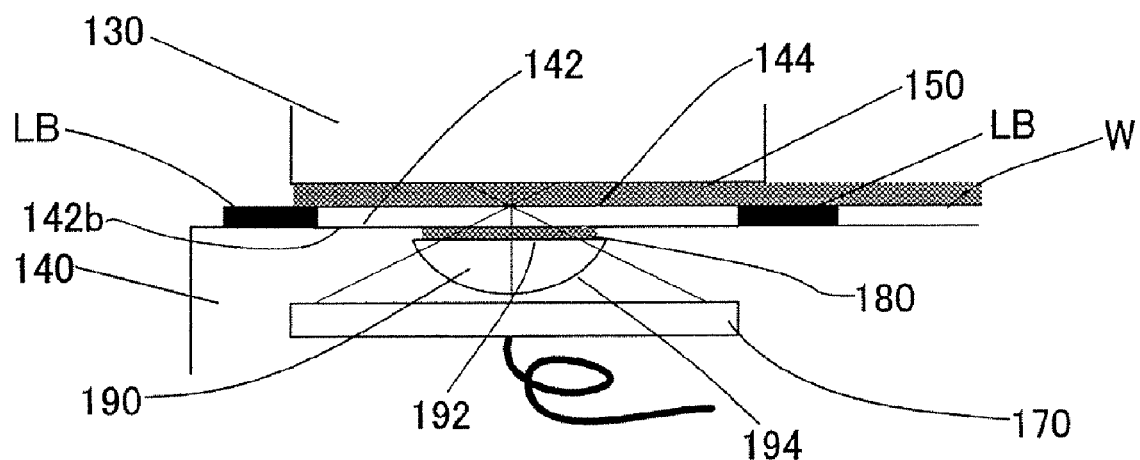
FIG. 6 is an enlarged view near the W-side reference plate of the exposure apparatus shown in FIG. 4.

Accordingly, one solution shown in FIG. 6 arranges a plane-convex lens 190 is arranged between the back surface 142b of the W-side reference plate 142 and the light-receiving element 170, and immerses the space between a plane 192 of the plane-convex lens 190 and the back surface 142b of the W-side reference plate 142 in the fluid 180. The plane-convex lens 190 is made, for example, of a lens formed by cutting a spherical lens or edgeless meniscus lens, and the plane 192 opposes to the wafer-side pattern 144. FIG. 6 is an enlarged view near the W-side reference plate 142 in the exposure apparatus 100A shown in FIG. 4.

This configuration enables the light that transmits the wafer-side pattern 144 to enter the plane-convex lens 190 without a total reflection on the back surface 142b of the W-side reference plate 142. Since a curved surface 194 of the plane-convex lens 190 receives approximately perpendicular light by approximately according the radius of curvature of the plane-convex lens 190 with the wafer-side pattern 144 on the W-side reference plate 142, even the light having an NA greater than 1 can enter the light-receiving element 170 without a total reflection on the curved surface 194. It is possible to fill the gas, such as the air and inert gas, in the space around the light-receiving element 170, i.e., between the plane-convex lens 190 and the light-receiving element 170. When a distance between the plane 192 of the plane-convex lens 190 and the back surface 142b of the W-side reference plate 142 is made smaller than the wavelength of the incident light, the light that transmits the wafer-side pattern 144 is prevented from being totally reflected on the back surface 142b of the W-side reference plate 142.

Figure 7:
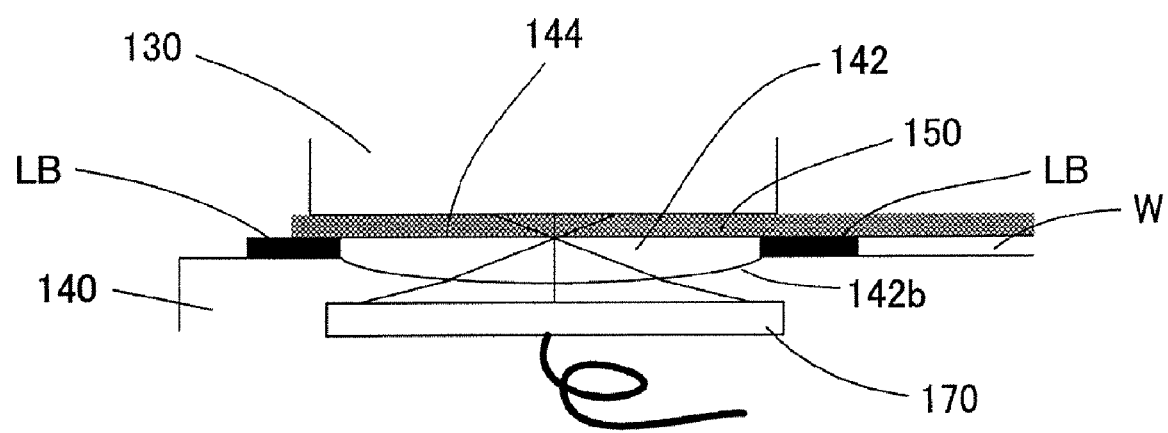
FIG. 7 is an enlarged view near the W-side reference plate of the exposure apparatus shown in FIG. 4.

As shown in FIG. 7, the light that transmits the wafer-side pattern 144 and has an NA greater than 1 can be enter the light-receiving element 170 by convexing the back surface 142b of the W-side reference plate 142. The curvature is set according to the NA of the light that transmits the wafer-side pattern 144 and the refractive index of the W-side reference plate 142 so that no total reflection occurs on the back surface 142b of the W-side reference plate 142 (or the convex surface having the curvature). Here, FIG. 7 is an enlarged view near the W-sided reference plate 142 of the exposure apparatus 10A shown in FIG. 4.

The above embodiment adopts the light intensity detecting method that detects the positional relationship between the reticle-side pattern 124 and the wafer-side pattern 144 by arranging the light-receiving element 170 at the side of the back surface 142b of the W-side reference plate 142 for the calibration system, and by detecting the light intensity changes of the light that transmits the illuminated wafer-side pattern 144. On the contrary, the following embodiment adopts the image detecting method that detects the positional relationship between the reticle-side pattern 124 and the wafer-side pattern 144 by using an optical system to image the wafer-side pattern 144 and the reticle-side pattern 124 on the image pickup device, such as a CCD.

Figure 8:
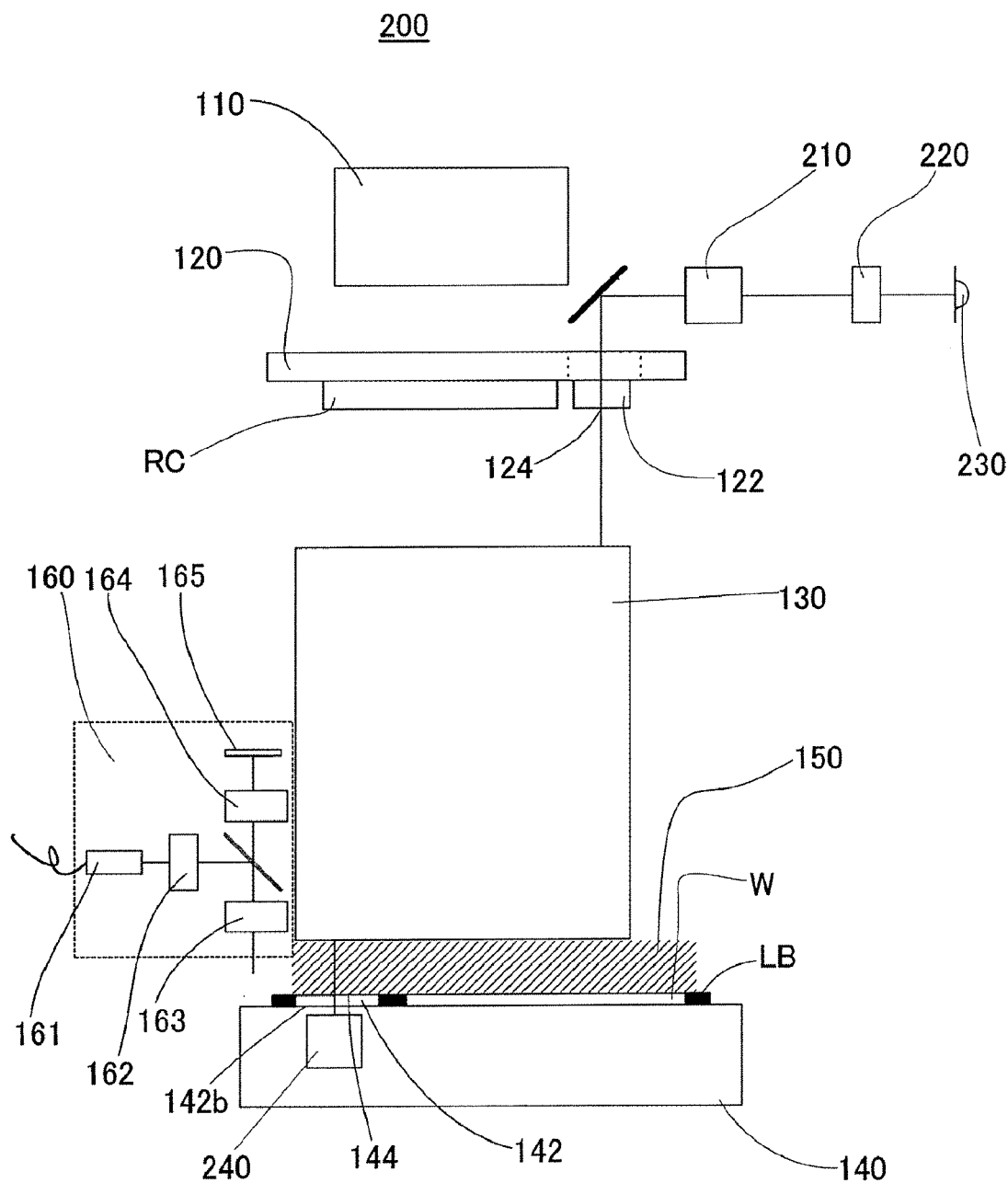
FIG. 8 is a schematic block diagram of a structure of an exposure apparatus according to another aspect of the present invention.

As shown in FIG. 8, the exposure apparatus 200 having the calibration system of the image detecting manner uses the optical system, such as the objective lens 210 and the relay lens 220, to image the reticle-side pattern 124 and the wafer-side pattern 144 on the image pickup device 230, and detects the positional relationship between the reticle-side pattern 124 and the wafer-side pattern 144, similar to the off-axis alignment optical system 160. The light source for the calibration system according to the image detecting method preferably uses the same wavelength as that of the exposure light, and generally uses the exposure light source. Here, FIG. 8 is a schematic block diagram showing a structure of an exposure apparatus 200 according to one aspect of the present invention.

The light from the light source section in the illumination apparatus 100 is introduced to the irradiation section 240 on the wafer stage 140 via a fiber (not shown) so as to illuminate the wafer-side pattern 144 on the W-side reference plate 142. The illuminated wafer-side pattern 144 is enlarged by the projection optical system 130, the objective lens 210, and the relay lens 220, and imaged on the image pickup device 230, such as a CCD. In addition to the objective lens 210 and the relay lens 220, another optical system may be added to improve the enlargement magnification.

The reticle-side pattern 124 on the R-side reference plate 122 (or the reticle RC) is illuminated using the light that transmits the wafer-side pattern 144 on the W-side reference plate 142 and passes the projection optical system 130. The illuminated reticle-side pattern 124 is enlarged and imaged on the image pickup device 230 using the objective lens 210 and the relay lens 220. Since this embodiment uses the exposure light, the reticle-side pattern 124 on the R-side reference plate 122 and the wafer-side pattern 144 on the W-side reference plate 142 have a similar imaging relationship to that for the exposure time. Therefore, the same optical system simultaneously detects the reticle-side pattern 124 and the wafer-side pattern 144. Thereby, an exposure position on the reticle-side pattern 124 can be precisely detected without considering the influence of errors of the optical system, etc.

Figure 9:
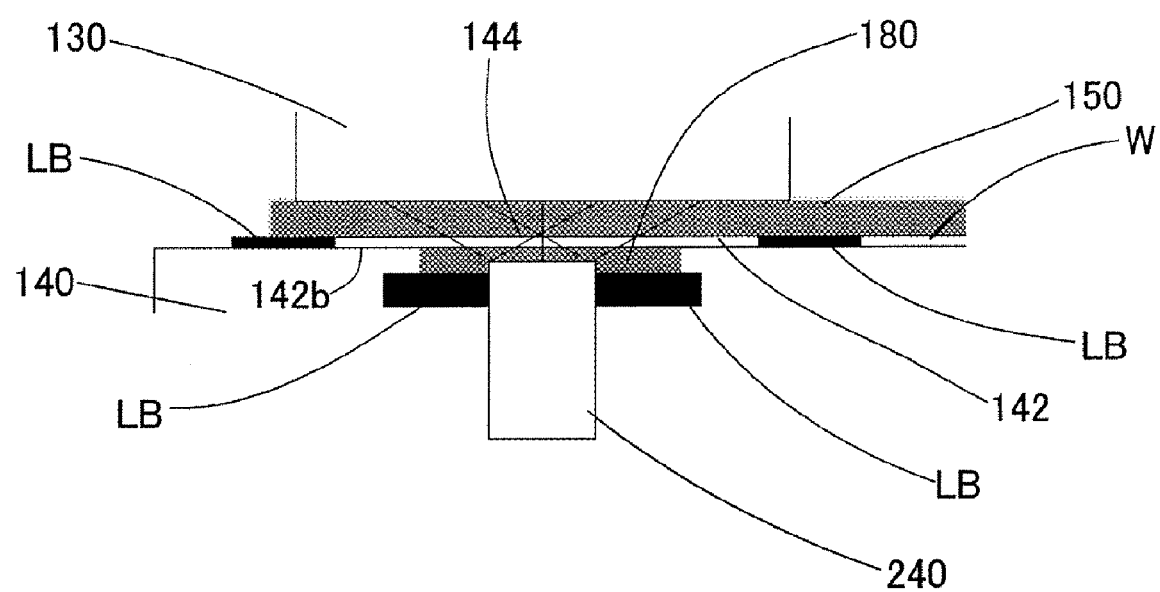
FIG. 9 is an enlarged view near the W-side reference plate of the exposure apparatus shown in FIG. 8.

This embodiment fills, with the fluid 180 as shown in FIG. 9, the space between the back surface 142*b* of the W-side reference plate 142 (or the wafer-side pattern 144) and the irradiating section 240 that irradiates the light having the same wavelength as that of the exposure light. This configuration enables, for example, the light having an NA of substantially 1.35 to enter the projection optical system 130, where the refractive index of the fluid 180 is 1.5, and the NA of the light irradiated from the irradiating section 240 is 0.9 in the air. In other words, an immersion of the space between the back surface 142*b* of the W-side reference plate 142 and the irradiating part 240 in the fluid 180 enables the light having an NA greater than 1 to enter the projection optical system 130, and the reticle-side pattern 142 and the wafer-side pattern 144 to be aligned with each other in the image detecting method. The instant embodiment is not limited to the image detecting method, but is effective to all the methods that make the light having an NA greater than 1 incident upon the projection optical system 130 from a side of the wafer stage 140. Here, FIG. 9 is an enlarged view near the W-side reference plate 142 of the exposure apparatus 200 shown in FIG. 8.

As discussed above, the immersion type exposure apparatus immerses the space between the projection optical system and the W-side reference plate and successfully forms an image of the reticle-side pattern on the W-side reference plate (or the wafer-side pattern), realizing a calibration that is as precise as the non-immersion type exposure apparatus. An immersion of the space between the back surface of the W-side reference plate and the light-receiving element enables the light that transmits the wafer-side pattern to completely enter the light-receiving element without the total reflection on the back surface of the W-side reference plate even if the NA of the projection optical system exceeds 1. Therefore, a positional relationship between the reticle-side pattern and the wafer-side pattern can be detected precisely. Other configurations, such as an arrangement of a plane-convex lens between the W-side reference plate and the light-receiving element, an immersion of the space between the back surface of the W-sided reference plate and the plane-convex lens, and an adjustment of a distance between the back surface of the W-side reference plate and the plane-convex lens to a distance below the wavelength of the light, also enable the light that transmits the wafer-side pattern to completely enter the light-receiving element without the total reflection on the back surface of the W-side reference plate even if the NA of the projection optical system exceeds 1. An immersion of the space between the back surface of the W-side reference plate and the irradiating section enables the light having an NA greater than 1 to enter the projection optical system from the wafer side and the reticle-side pattern and the wafer-side pattern to be aligned with each other in accordance with the image detecting method. It may be said that the above exposure apparatus includes an adjusting means, such as the fluid and plane-convex lens, for adjusting the NA of the light between the W-side reference plate and the light-receiving element.

In exposure, light emitted from an illumination apparatus 110, for example, Koehler-illuminates the reticle RC. The light that has passed the reticle RC and reflects the reticle pattern forms an image on the wafer W through the projection optical system 130. Since the exposure apparatuses 100, 100A and 200 can realize highly precise calibration and accurately align the reticle RC with the wafer W, the exposure apparatus 1 can provide higher quality devices (such as semiconductor devices, LCD devices, image pick-up devices (such as CCDs), and thin film magnetic heads) than the conventional.

A non-immersion type exposure apparatus is also required to have a projection optical system with a higher NA, e.g., an NA of 0.9 or greater, along with the demands for finer processing to semiconductors. On the other hand, the high NA of the projection optical system requires a light-receiving element having a large light receiving area for calibrations in the light intensity detecting method. This is disadvantageous because the wafer stage becomes large when the light-receiving element having the large light receiving area is provided on the wafer stage. Another problem occurs when the light that has a high NA and is most sensitive to changes of the focus and imaging performance (or aberration) of the projection optical system is reflected on the back surface of the W-side reference plate and thus is not incident upon the light-receiving element.

Figure 10:
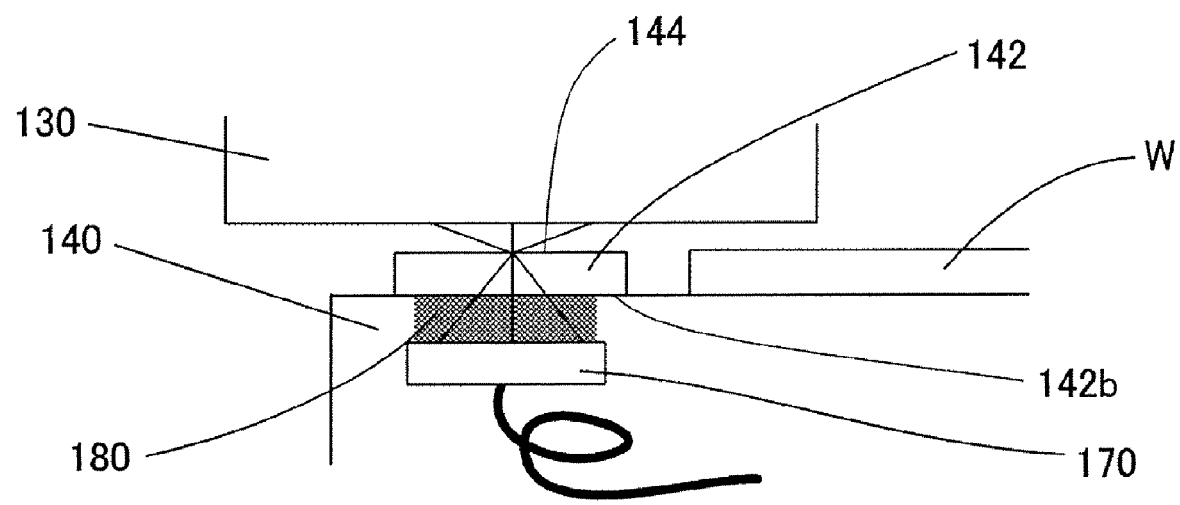
FIG. 10 is an enlarged view near the W-side reference plate in a non-immersion type exposure apparatus having a numerical aperture of 0.8 or greater.

Accordingly, the space between the back surface 142*b* of the W-side reference plate 142 (or the wafer-side pattern 144) and the light-receiving element 170 is immersed in the fluid 180 having a refractive index greater than 1, as shown in FIG. 10, in a non-immersion type exposure apparatus that includes a projection optical system 130 having an NA of 0.8 or greater, and does not immerse the space between the projection optical system 130 and the wafer W. The fluid 180 preferably has a refractive index equal to that of the W-side reference plate 142. An immersion of the space between the back surface 142*b* of the W-side reference plate 142 and the light-receiving element 170 in the fluid 180 can reduce a diameter of the light that transmits the wafer-side pattern 144 and enters the light-receiving element 170. For example, where the thickness of the substrate is 3.0 mm, the refractive index is 1.5, a distance between the back surface of the substrate and the sensor is 2 mm, the refractive index of the fluid is 1.5, and the NA of the projection optical system is 0.8, the effective diameter on the sensor surface is 9.1 mm if the space between the back surface and the sensor is filled with the air, and 6.3 mm if the space between the back surface and the sensor is immersed. Therefore, the effective diameter is reduced down to about 70%. Here, FIG. 10 is an enlarged view near the W-side reference plate in a non-immersion type exposure apparatus having an NA of 0.8 or greater.

Figure 14:
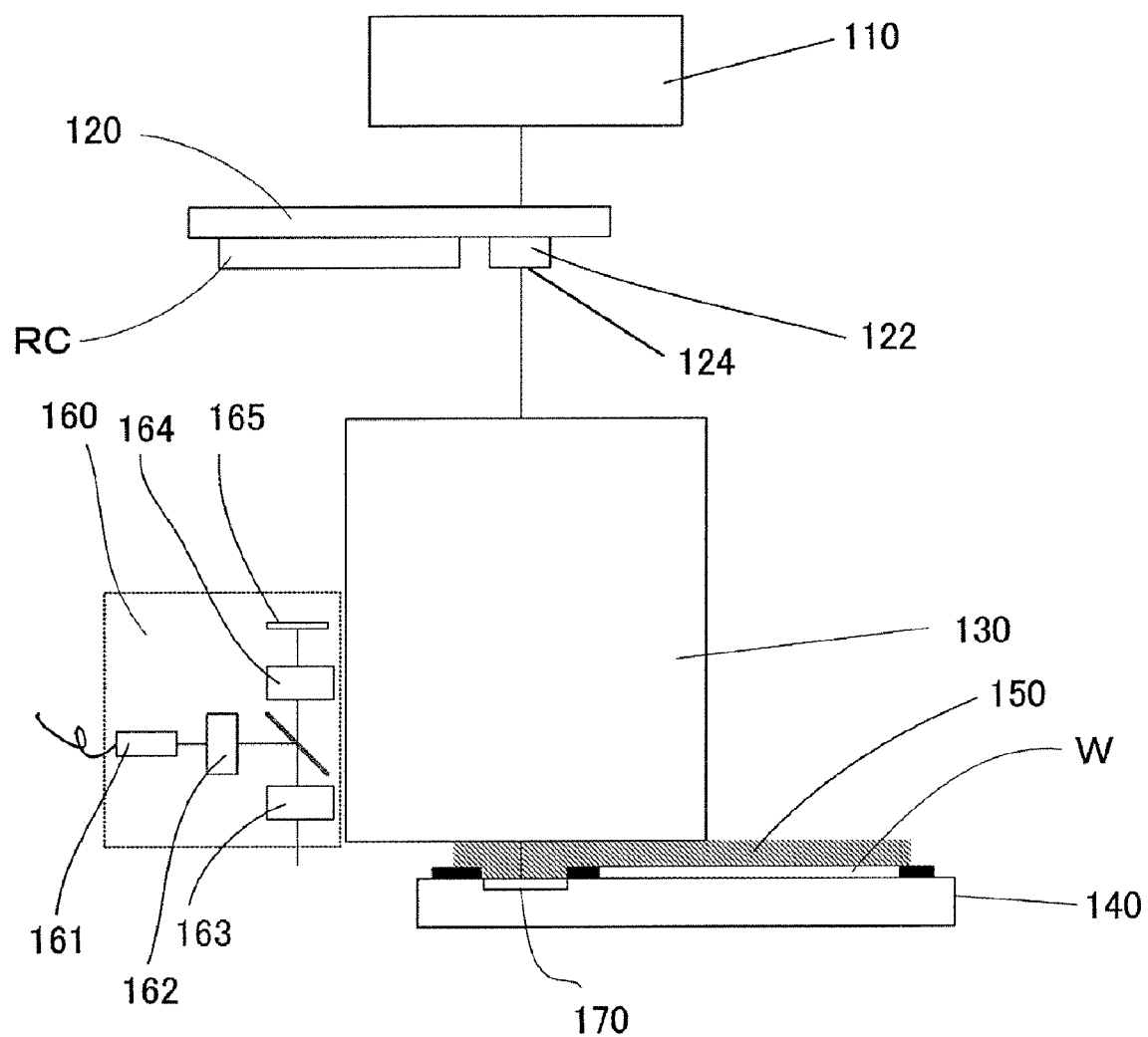
FIG. 14 is a schematic block diagram showing a structure of an exposure apparatus that immerses the space between the sensor and the projection optical system.

A description will be given of another embodiment of the present invention. While the above embodiment forms the W-side reference plate 142 on the wafer stage 140, this embodiment immerses the space between the sensor 170 and the projection optical system 130 in the fluid 150 as shown in FIG. 14 without forming the W-side reference plate 142. This configuration enables the immersion type exposure apparatus to use the sensor 170 on the wafer stage 140 to measure the light intensity on the wafer stage, and the transmittance of the projection optical system 130. It is also possible to arrange a sensor that includes devices arranged in an array shape, such as a CCD, near the image surface, and to measure the position of the light projected on the sensor for use with the alignment. As shown in FIG. 14, a CCD may be arranged at a defocus position in order to simply observe a pupil surface of the projection optical system.

For example, when there is the air between the W-side reference plate 142 and the light-receiving element 170, the light refracts and diverges on the back surface 142b of the W-side reference plate 142, increasing the effective diameter. On the other hand, as shown in FIG. 10, when the fluid 180 is having the same refractive index as that of the W-side reference plate 142 immerses the space between the back surface 142b of the W-side reference plate 142 and the light-receiving element 170, as shown in FIG. 10, the light does not refract on the back surface 142b of the W-side reference plate 142, and the diameter of the incident light upon the light-receiving element 170 can be made small. In addition, no reflection occurs on the back surface 142b of the W-side reference plate 142, the light can enter the light-receiving element 170 without losses of the reflections of the light having a large NA. As discussed above, if it is difficult to immerse the light-receiving element 170 itself in the fluid 180, use of the plane-convex lens or the shaping the back surface 142b of the W-side reference plate 142 into a convex shape would provide similar effects.

The above non-immersion type exposure apparatus can immerse the space between the W-side reference plate and the light-receiving element, reduce the size of the light-receiving element by arranging the plane-convex lens, and detect light-intensity changes while restraining the influence of the reflectance on the back surface of the W-sided reference plate.

Figure 11:
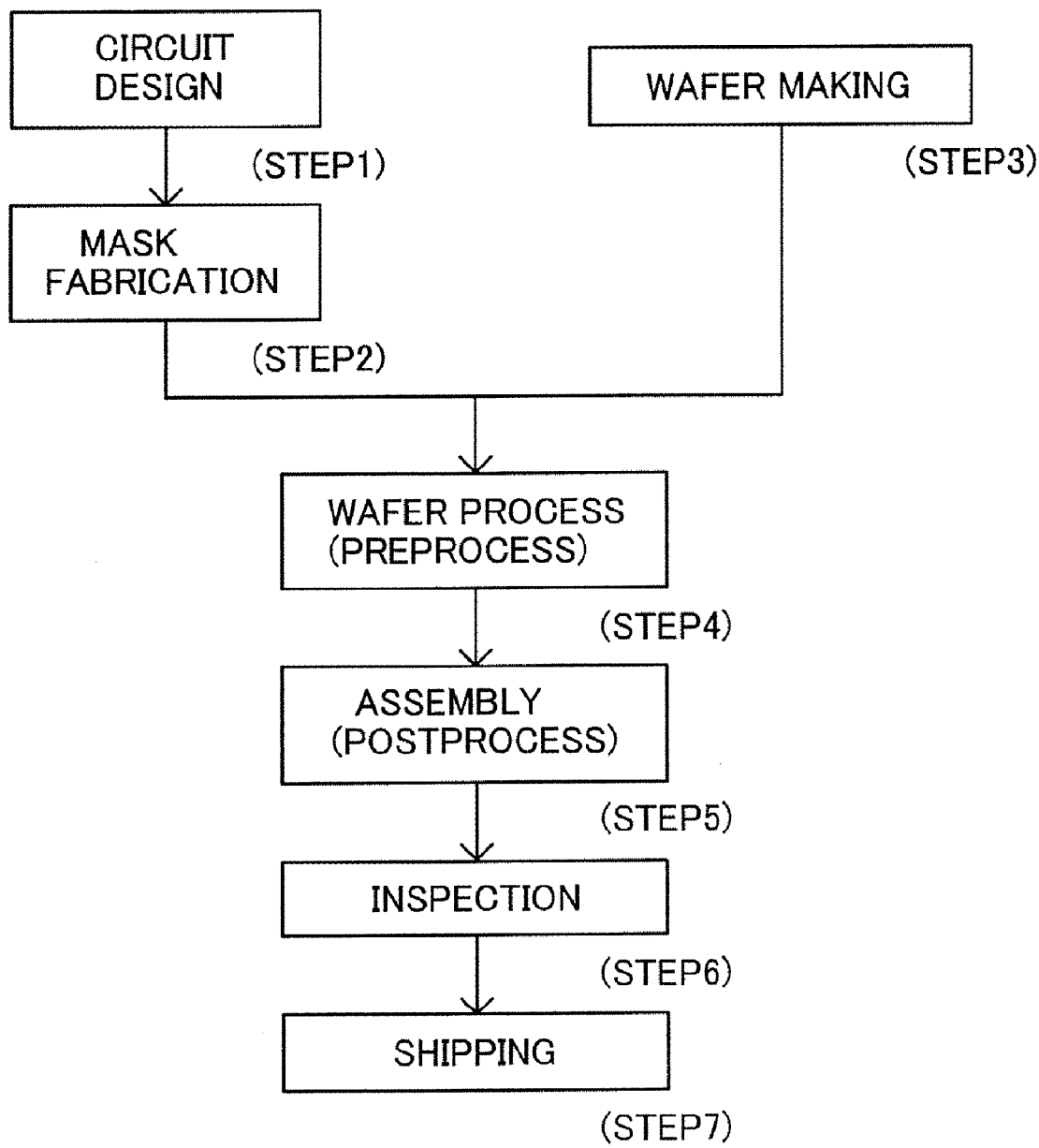
FIG. 11 is a flowchart for explaining a method for fabricating devices (semiconductor chips such as ICs, LSIs, and the like, LCDs, CCDs, etc.).
Figure 12:
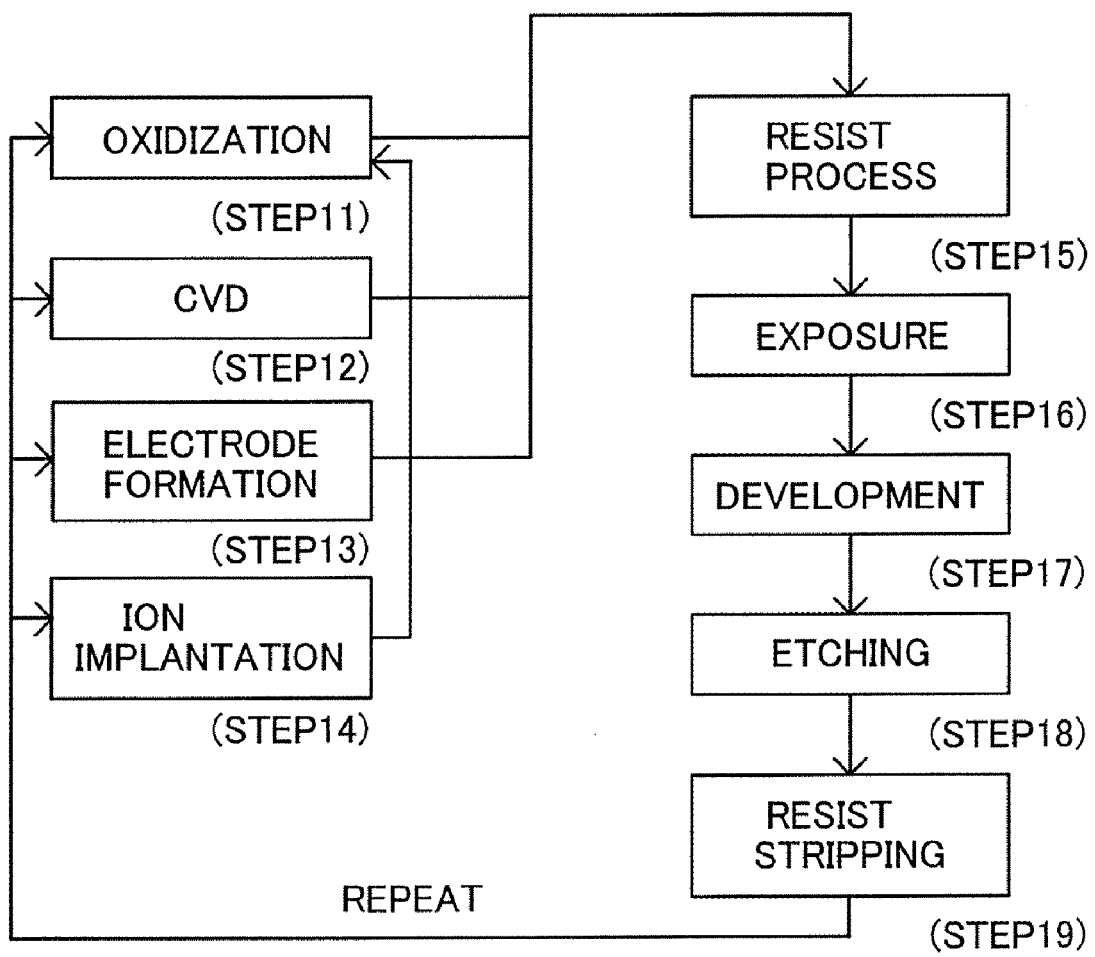
FIG. 12 is a detailed flowchart for Step 4 of wafer process shown in FIG. 11.

Referring to FIGS. 11 and 12, a description will now be given of an embodiment of a device fabricating method using the above exposure apparatus. FIG. 11 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 12 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device manufacture method of the present invention may manufacture higher quality devices than the conventional one. Thus, the device manufacturing method using the inventive lithography, and resultant devices themselves as intermediate and finished products also constitute one aspect of the present invention. Such devices include semiconductor chips like an LSI and VLSI, CODs, LCDs, magnetic sensors, thin film magnetic heads, and the like.

Thus, the present invention can provide an exposure apparatus having a projection optical system that has a high NA (such as an immersion type or 1<NA), and realizes a precise alignment and an exposure with superior resolution without increasing the size of the apparatus.

Further, the present invention is not limited to these preferred embodiments, and various modifications and changes may be made in the present invention without departing from the spirit and scope thereof. For example, the present invention is applicable, for example, to use of the light-receiving element provided on the wafer stage to measure the light intensity on the wafer stage and the transmittance of the projection optical system.

This application also claims foreign priority benefits based on Japanese Patent Application No. 2003-409881, filed on Dec. 9, 2003, which is hereby incorporated by reference herein in its entirety as if fully set forth herein.

What is claimed is:

1. An exposure apparatus for exposing an object via liquid, said exposure apparatus comprising:
   a projection optical system for projecting a pattern of a reticle onto a object;
   a stage for supporting the object;
   a plate that is provided on the stage, and has a light shielding part and a light transmitting part on a front surface of the plate;
   a planoconvex lens having a plane that faces a back surface of the plate; and
   a light-receiving element for receiving light that has transmitted through the projection optical system, the liquid, the plate, and the planoconvex lens,
   wherein a center of curvature of a convex surface of the planoconvex lens substantially accords with the front surface of the plate.

* * * * *